(12) United States Patent
Glickman et al.

(10) Patent No.: US 10,154,583 B1
(45) Date of Patent: Dec. 11, 2018

(54) MECHANICAL STRAIN REDUCTION ON FLEXIBLE AND RIGID-FLEXIBLE CIRCUITS

(71) Applicant: Multek Technologies Limited, San Jose, CA (US)

(72) Inventors: Michael James Glickman, Mountain View, CA (US); Mark Bergman, Redwood City, CA (US); Joan Vrtis, Mesa, AZ (US)

(73) Assignee: Flex Ltd, Singapore (SG)

( * ) Notice: Subject to any disclaimer, the term of this patent is extended or adjusted under 35 U.S.C. 154(b) by 0 days.

(21) Appl. No.: 15/081,794

(22) Filed: Mar. 25, 2016

Related U.S. Application Data

(60) Provisional application No. 62/139,446, filed on Mar. 27, 2015.

(51) Int. Cl.
| | |
|---|---|
| *H05K 1/02* | (2006.01) |
| *H05K 1/03* | (2006.01) |
| *H05K 1/09* | (2006.01) |
| *H05K 3/10* | (2006.01) |

(52) U.S. Cl.
CPC ......... *H05K 1/0278* (2013.01); *H05K 1/0283* (2013.01); *H05K 1/0296* (2013.01); *H05K 1/0346* (2013.01); *H05K 1/09* (2013.01); *H05K 1/0393* (2013.01); *H05K 3/103* (2013.01)

(58) Field of Classification Search
CPC ...... H05K 1/0278; H05K 1/09; H05K 1/0346; H05K 1/0296
See application file for complete search history.

(56) References Cited

U.S. PATENT DOCUMENTS

| | | |
|---|---|---|
| 2,911,605 A | 11/1959 | Wales, Jr. |
| 4,051,425 A | 9/1977 | Smith |
| 4,495,546 A | 1/1985 | Nakamura et al. |
| 4,712,160 A | 12/1987 | Sato et al. |
| 4,788,626 A | 11/1988 | Neidig et al. |
| 4,893,227 A | 1/1990 | Gallios et al. |
| 4,899,256 A | 2/1990 | Sway-Tin |
| 4,901,069 A | 2/1990 | Veneruso |

(Continued)

OTHER PUBLICATIONS

Non-final office action dated Jun. 14, 2017, U.S. Appl. No. 14/724,673, filed May 28, 2015, 24 pages.

(Continued)

*Primary Examiner* — Ishwarbhai B Patel
(74) *Attorney, Agent, or Firm* — Haverstock & Owens LLP

(57) ABSTRACT

A mechanical strain reduction system include a flexible circuit section of a printed circuit board configured with a meandering shape while in a static state, and a compressible material having a cavity such that the meandering flexible circuit section is positioned within the cavity while the flexible circuit section is in the static state. The flexible circuit section can be part of a rigid-flexible printed circuit board or a flexible printed circuit board. The cavity can be shaped with the same meandering shape as the flexible circuit section in the static state. In general, the cavity is sufficiently shaped to allow positioning of the meandering flexible circuit section within the cavity. Support structures of the same, or different, compressible material can be interspersed within the meander of the flexible circuit section.

17 Claims, 3 Drawing Sheets

(56) References Cited

U.S. PATENT DOCUMENTS

| | | | |
|---|---|---|---|
| 4,975,821 A | 12/1990 | Lethellier | |
| 5,101,322 A | 3/1992 | Ghaem et al. | |
| 5,164,657 A | 11/1992 | Gulczynki | |
| 5,235,491 A | 8/1993 | Weiss | |
| 5,262,932 A | 11/1993 | Stanley et al. | |
| 5,295,044 A | 3/1994 | Araki et al. | |
| 5,490,052 A | 2/1996 | Yoshida et al. | |
| 5,565,761 A | 10/1996 | Hwang | |
| 5,565,781 A | 10/1996 | Dauge | |
| 5,592,128 A | 1/1997 | Hwang | |
| 5,651,176 A | 7/1997 | Ma | |
| 5,712,772 A | 1/1998 | Telefus et al. | |
| 5,747,977 A | 5/1998 | Hwang | |
| 5,798,635 A | 8/1998 | Hwang et al. | |
| 5,804,950 A | 9/1998 | Hwang et al. | |
| 5,811,895 A | 9/1998 | Suzuki et al. | |
| 5,818,207 A | 10/1998 | Hwang | |
| 5,870,294 A | 2/1999 | Cyr | |
| 5,894,243 A | 4/1999 | Hwang | |
| 5,903,138 A | 5/1999 | Hwang et al. | |
| 5,905,369 A | 5/1999 | Ishii et al. | |
| 5,923,543 A | 7/1999 | Choi | |
| 6,039,600 A | 3/2000 | Etters et al. | |
| 6,038,026 A | 5/2000 | Rozman | |
| 6,069,803 A | 5/2000 | Cross | |
| 6,077,124 A | 6/2000 | Etters et al. | |
| 6,160,725 A | 12/2000 | Jansen | |
| 6,272,015 B1 | 8/2001 | Mangtani | |
| 6,282,092 B1 | 8/2001 | Okamoto et al. | |
| 6,344,980 B1 | 2/2002 | Hwang et al. | |
| 6,358,064 B2 | 3/2002 | Szaley et al. | |
| 6,396,277 B1 | 5/2002 | Fong et al. | |
| 6,407,514 B1 | 6/2002 | Glaser et al. | |
| 6,469,914 B1 | 10/2002 | Hwang et al. | |
| 6,469,980 B1 | 10/2002 | Takemura et al. | |
| 6,483,281 B2 | 11/2002 | Hwang | |
| 6,605,930 B2 | 2/2003 | Hwang | |
| 6,531,854 B2 | 3/2003 | Hwang | |
| 6,534,723 B1 | 3/2003 | Asai | |
| 6,541,944 B2 | 4/2003 | Hwang | |
| 6,578,253 B1 | 6/2003 | Herbert | |
| 6,657,417 B1 | 12/2003 | Hwang | |
| 6,671,189 B2 | 12/2003 | Jansen et al. | |
| 6,674,272 B2 | 1/2004 | Hwang | |
| 6,743,982 B2 | 6/2004 | Biegelsen | |
| 6,958,920 B2 | 10/2005 | Mednik et al. | |
| 7,047,059 B2 | 5/2006 | Avrin et al. | |
| 7,167,373 B1 | 1/2007 | Hoang | |
| 7,286,376 B2 | 10/2007 | Yang | |
| 7,439,962 B2 | 10/2008 | Reynolds et al. | |
| 7,456,571 B1 | 11/2008 | Wedding | |
| 8,207,473 B2 | 6/2012 | Axisa | |
| 8,269,112 B2 | 9/2012 | Lee | |
| 8,883,287 B2 | 11/2014 | Boyce | |
| 9,018,532 B2 * | 4/2015 | Wesselman | 361/649 |
| 9,247,648 B2 | 1/2016 | Vanfleteren | |
| 9,340,003 B2 | 5/2016 | Chang | |
| 9,418,927 B2 | 8/2016 | Axisa | |
| 9,538,641 B2 | 1/2017 | Markus | |
| 9,699,893 B2 | 7/2017 | Matsumoto | |
| 9,706,647 B2 | 7/2017 | Hsu | |
| 9,730,330 B1 | 8/2017 | Boyle | |
| 2002/0011823 A1 | 1/2002 | Lee | |
| 2003/0035303 A1 | 2/2003 | Balakrishnan et al. | |
| 2004/0113250 A1 | 6/2004 | Khandros | |
| 2004/0192082 A1 | 9/2004 | Wagner | |
| 2004/0228153 A1 | 11/2004 | Cao et al. | |
| 2005/0105224 A1 | 5/2005 | Nishi | |
| 2005/0281425 A1 | 12/2005 | Greuet et al. | |
| 2008/0241663 A1 | 10/2008 | Yamashita | |
| 2009/0317639 A1 | 12/2009 | Axisa | |
| 2010/0116526 A1 | 5/2010 | Arora | |
| 2011/0050381 A1 | 3/2011 | Olson | |
| 2011/0114376 A1 | 5/2011 | Shoji | |
| 2011/0119812 A1 | 5/2011 | Genz | |
| 2011/0163569 A1 | 7/2011 | Yoneyama | |
| 2011/0262785 A1 | 10/2011 | Johnson | |
| 2012/0051005 A1 * | 3/2012 | Vanfleteren | H01L 21/565 361/749 |
| 2012/0279762 A1 * | 11/2012 | Hur | B82Y 30/00 174/254 |
| 2012/0314382 A1 * | 12/2012 | Wesselmann | H05K 1/0283 361/749 |
| 2013/0220535 A1 | 8/2013 | Lee | |
| 2014/0124245 A1 | 5/2014 | Lai | |
| 2014/0190727 A1 | 7/2014 | Lee | |
| 2014/0220422 A1 | 8/2014 | Rogers | |
| 2015/0065840 A1 * | 3/2015 | Bailey | A61B 5/6802 600/384 |
| 2016/0007468 A1 | 1/2016 | Tomikawa | |
| 2016/0132150 A1 | 5/2016 | Cotton | |
| 2016/0183372 A1 | 6/2016 | Park | |
| 2017/0358841 A1 | 12/2017 | Chen | |
| 2018/0070446 A1 | 3/2018 | Takahashi | |

OTHER PUBLICATIONS

Notice of Allowance dated Feb. 26, 2018, U.S. Appl. No. 14/995,139, filed Jan. 13, 2016, applicant: Pui Yin Yu, 9 pages.

* cited by examiner

MECHANICAL STRAIN REDUCTION ON FLEXIBLE AND RIGID-FLEXIBLE CIRCUITS

RELATED APPLICATIONS

This Patent Application claims priority under 35 U.S.C. 119(e) of the U.S. provisional patent application, Application No. 62/139,446, filed on Mar. 27, 2015, and entitled "MECHANICAL STRAIN REDUCTION ON FLEX AND RIGID FLEX CIRCUITS," which is hereby incorporated by reference in its entirety.

FIELD OF THE INVENTION

The present invention is generally directed to circuit boards. More specifically, the present invention is directed to flexible and rigid-flexible circuit boards and reducing mechanical strain on such circuit boards.

BACKGROUND OF THE INVENTION

A printed circuit board (PCB) mechanically supports and electrically connects electronic components using conductive traces, pads and other features etched from electrically conductive sheets, such as copper sheets, laminated onto a non-conductive substrate. Multi-layered printed circuit boards are formed by stacking and laminating multiple such etched conductive sheet/non-conductive substrate. Conductors on different layers are interconnected with vias. Vias can be mechanically or laser drilled. Vias can have copper plating on a portion of the sidewalls or be plated completely.

A printed circuit board includes a plurality of stacked layers, the layers made of alternating non-conductive layers and patterned conductive layers. The non-conductive layers can be made of prepreg or base material that is part of a core structure, or simply core. Prepreg is a fibrous reinforcement material impregnated or coated with a thermosetting resin binder, and consolidated and cured to an intermediate stage semi-solid product. Prepreg is used as an adhesive layer to bond discrete layers of multilayer PCB construction, where a multilayer PCB consists of alternative layers of conductors and base materials bonded together, including at least one internal conductive layer. A base material is an organic or inorganic material used to support a pattern of conductor material. A core is a metal clad base material where the base material has integral metal conductor material on one or both sides. A laminated stack is formed by stacking multiple core structures with intervening prepreg and then laminating the stack.

In some applications, it is desirable to form a flexible portion, or section, of a printed circuit board that is bendable yet remains interconnected to other rigid sections of the printed circuit board, thereby forming a rigid-flexible printed circuit board. The flexible portion is typically not glass-reinforced and is composed of thinner layers, thus decreasing the bending stiffness and making it flexible. In still other applications, the entire printed circuit board is flexible, thereby forming a flexible printed circuit board.

Rigid-flexible printed circuit boards and flexible printed circuit boards are increasingly being used in applications, such as wearable electronics, where the flexible sections are subject to repeated bending, twisting, torquing or other such deformation relative to its static state. Such repeated deformation subjects the flexible section of the printed circuit board to mechanical stresses and strains, possibly leading to circuit failure. An example of such an application is that observed in shoes, where impact of a shoe to ground results in single or multiple strain and strain events.

SUMMARY OF THE INVENTION

Embodiments of a mechanical strain reduction system include a flexible circuit section of a printed circuit board configured with a meandering shape while in a static state, and a compressible material having a cavity such that the meandering flexible circuit section is positioned within the cavity while the flexible circuit section is in the static state. The flexible circuit section can be part of a rigid-flexible printed circuit board or a flexible printed circuit board. In some embodiments, the cavity can be shaped with the same meandering shape as the flexible circuit section in the static state. In other embodiments, the cavity is sufficiently shaped to allow positioning of the meandering flexible circuit section within the cavity. Support structures of the same, or different, compressible material can be interspersed within the meander of the flexible circuit section.

In an aspect, a mechanical strain reduction system is disclosed. The mechanical strain reduction system includes a flexible circuit section having a meandering shape while in a static state, and a compressible material. A cavity is formed in a first surface of the compressible material, the cavity having a shape that enables the flexible circuit section in the static state to be positioned within the cavity. In some embodiments, the meandering shape comprises a series of arched curves. In some embodiments, each arched curve has an angle between 45 and 300 degrees. In some embodiments, the meandering shape comprises a serpentine-like shape. In some embodiments, the flexible circuit section comprises a flexible substrate and one or more electrically conductive traces coupled to the flexible substrate. In some embodiments, the flexible substrate comprises polyimide. In some embodiments, the one or more electrically conductive traces comprise copper conductors. In some embodiments, the shape of the cavity matches the meandering shape. In some embodiments, the mechanical strain reduction system further comprises one or more support structures within the cavity, wherein the flexible circuit section meanders around the one or more support structures. In some embodiments, the one or more support structures comprise the compressible material. In some embodiments, the flexible circuit section free-floats on a bottom surface of the cavity. In some embodiments, the flexible circuit section has a first end and a second end, further wherein the first end and the second end of the flexible circuit section are secured to a bottom surface of the cavity whereas a remaining portion of the flexible circuit section between the first end and the second end is free-floating on the bottom surface of the cavity.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Figure 1:
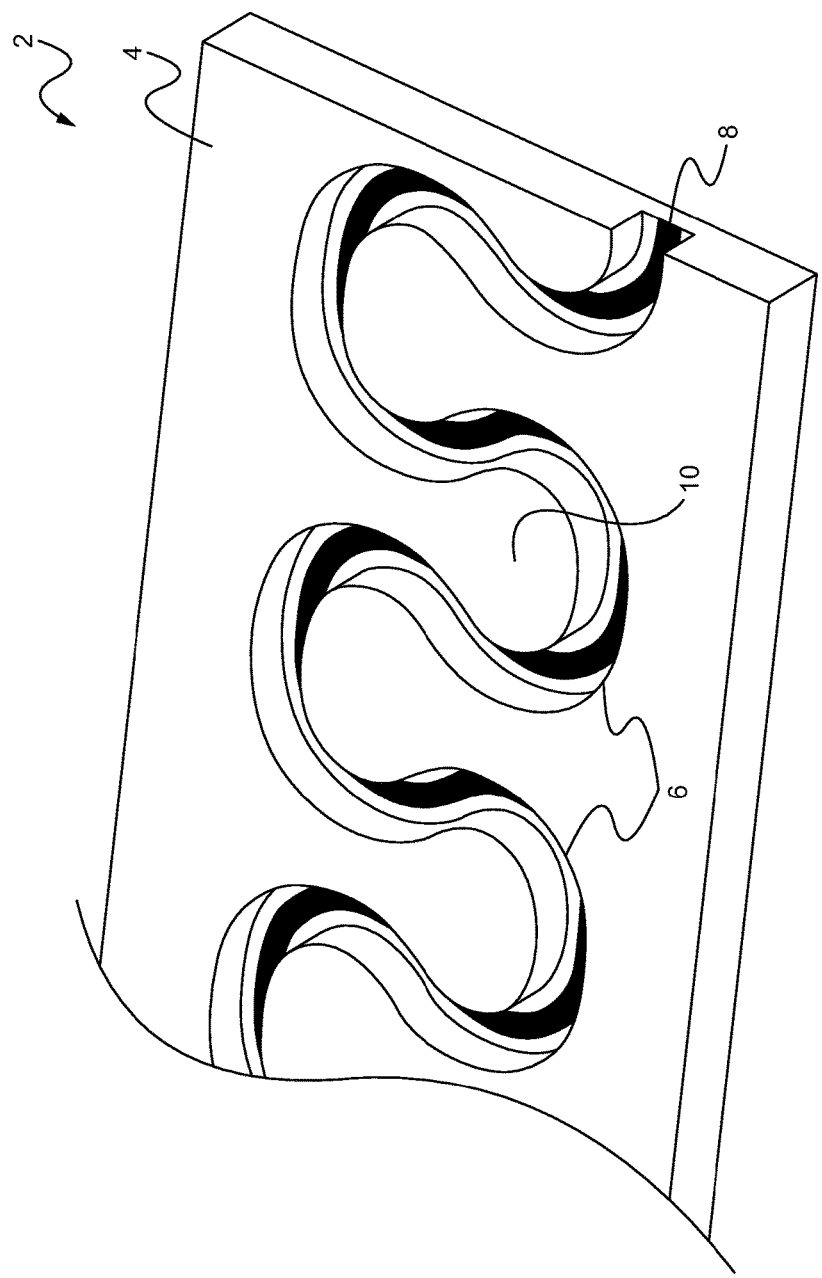
FIG. 1 illustrates a top down perspective view of a mechanical strain reduction system according to some embodiments.

Embodiments of the present application are directed to a mechanical strain reduction system. Those of ordinary skill in the art will realize that the following detailed description of the mechanical strain reduction system is illustrative only and is not intended to be in any way limiting. Other embodiments of the mechanical strain reduction system will readily suggest themselves to such skilled persons having the benefit of this disclosure.

Reference will now be made in detail to implementations of the mechanical strain reduction system as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

As used herein, "meandering" refers to a non-linear shape. In some embodiments, the meandering shape has arched curves, such as various serpentine shapes. In some embodiments, while in the static state the flexible circuit section has a thickness (z-direction) and traverses an x-y plane, and the meandering shape is in the x-y plane of the flexible circuit section. The cavity allows the meander shaped flexible circuit section to find the lowest energy shape, and this naturally minimizes the strain energy stored. This minimizes the strain seen at conductive traces when the flexible circuit section is stretched or compressed along the x-axis (see FIG. 1), and increases the lifetime of the flexible circuit section. For example, if one exerts a tensile or compressive strain of 10% on the flexible circuit section, the meander shape may reduce the strain to 1%, depending on the shape of the meander. The cavity structure and corresponding support sections are designed to allow some compression but prevent the meandering flexible circuit section from being completely pinched when fully compressed. For example, this design can be incorporated into a wearable object that undergoes high compressive strain, such as the sole of a shoe. In this example, the wearer flexes the foot at the ball of the foot, the bending motion is translated into a compression along the long axis of the foot. If the wearer flexes the foot in the opposite direction, the bending motion is translated into tension along the long axis of the foot. The purpose is to reduce strain, as it is known that straight (non-meandering) rigid-flexible and flexible circuit sections have failed prematurely when exposed to the same amount of stress and strain as that of a meandering outline. In this example, the sole of the shoe is made from a compressible material such as foam.

FIG. 1 illustrates a top down perspective view of a mechanical strain reduction system according to some embodiments. The mechanical reduction system 2 includes a compressible material 4 having a cavity, or trench, 6 and a flexible circuit section 8. The flexible circuit section 8 is formed having a meandering shape while in a static state. The mechanical strain reduction system 2 shown in FIG. 1 is in the static state, where the static state refers to that state where no external force is applied. An example of an applied external force is when a foot presses down on the mechanical strain reduction system, such as when a person is walking and the shoe contacts the ground during a step.

The flexible circuit section 8 is a metal clad structure including a flexible non-conductive substrate and patterned conductive material formed on either a single surface of the flexible substrate or on both opposing surfaces of the flexible substrate. In some embodiments, the flexible circuit section is an FCCL (flexible copper clad laminate) or other non-conductive flexible material layer having a patterned conductive layer on one or both surfaces of the non-conductive layer. The conductive layers are patterned and etched to form conductive interconnects, also referred to as conductive traces. In some embodiments, the flexible circuit section is made of non-conductive polyimide material with patterned copper traces on single or double sides. Polyimide is bendable.

As described above, the flexible circuit section is fabricated such that in its static state it has the meandering shape. The flexible circuit section can be fabricated by laser cutting or mechanically punching a sheet of the flexible substrate into the meandering shape. The conductive traces can either be formed prior to or after the meandering shaped flexible substrate is formed. It is understood that alternative conventional techniques can be used to fabricate the flexible circuit section.

In the exemplary configuration shown in FIG. 1, the cavity 6 is shaped to match the meandering shape of the flexible circuit section 8 while in the static state. In this manner, portions of the compressible material 4 form support sections 10 interspersed within the meandering shape of the flexible circuit section 8. The flexible circuit section 8 is positioned in the cavity 6 and on a bottom surface of the cavity. In some embodiments, a size and meandering shape of the flexible circuit section matches a size and meandering shape of the cavity such that the sides of the flexible circuit section contact the sides of the cavity while in the static state. In other embodiments, the size of the flexible circuit section is smaller than that of the cavity such that the sides of the flexible circuit section do not contact the sides of the cavity while in the static state.

Figure 2:
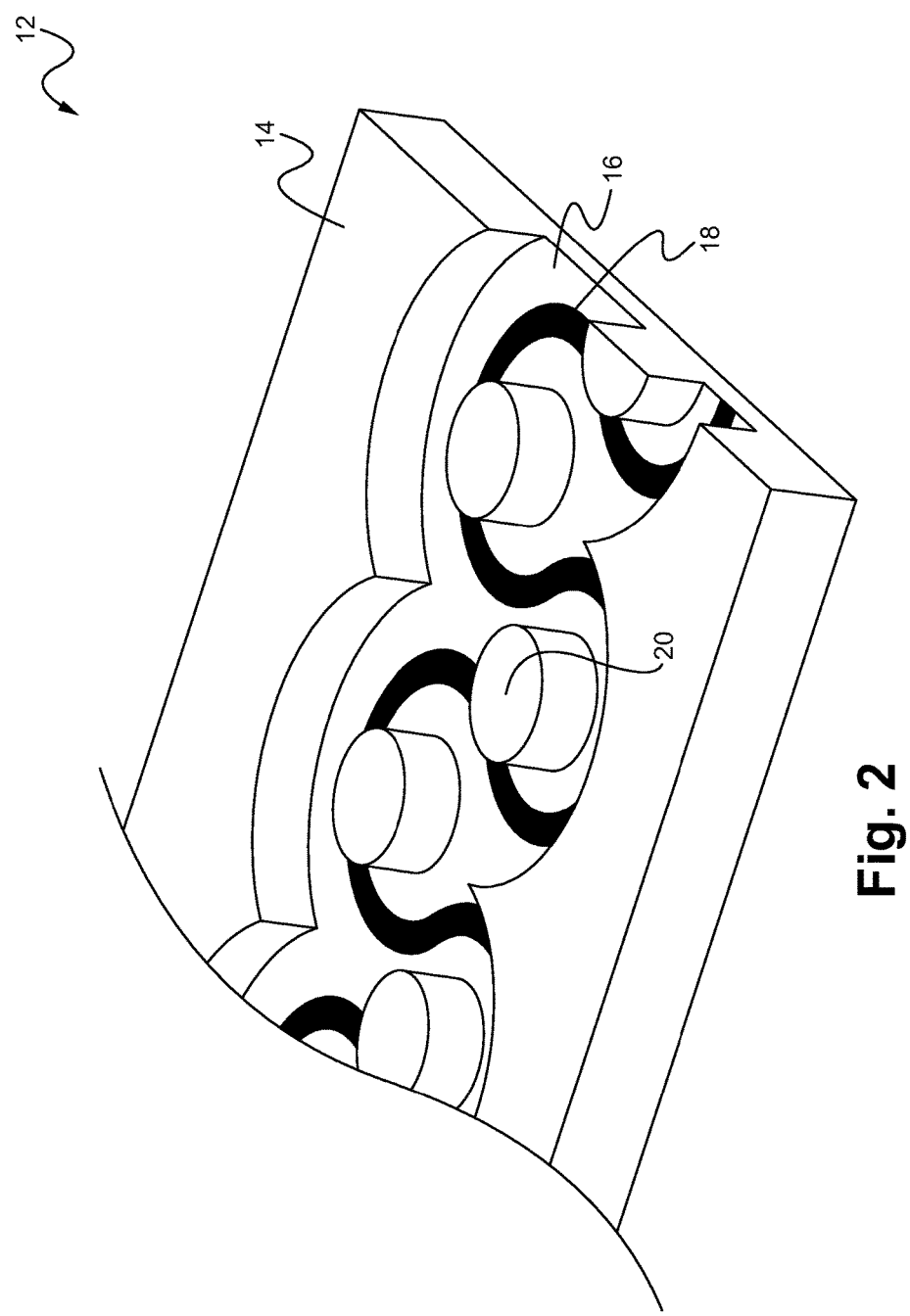
FIG. 2 illustrates a top down perspective view of a mechanical strain reduction system according to other embodiments.

In alternative configurations, the cavity is not shaped to match the shape of the flexible circuit section. In such alternative configurations, the cavity is shaped to enable the flexible circuit section in its static state to be positioned within the cavity. FIG. 2 illustrates a top down perspective view of a mechanical strain reduction system according to other embodiments. The mechanical reduction system 12 includes a compressible material 14 having a cavity 16 and a flexible circuit section 18. The flexible circuit section 18 is formed having a meandering shape while in a static state, however, a shape of the cavity 16 does not match that of the flexible circuit section 18. A shape of the cavity 16 accommodates positioning of the flexible circuit section 18 within the cavity 16 and on the bottom surface of the cavity 16. In some embodiments, a perimeter edge of the cavity 16 is similarly shaped as that of proximate portions of the flexible circuit section 18. In the exemplary configuration shown in FIG. 2, the perimeter edge of the cavity 16 has curved arches that substantially match proximate curved portions of the flexible circuit section 18. Providing similarly shaped perimeter edges enables the cavity to provide lateral support to the flexible circuit section when force is applied. It is understood that the perimeter shape of the cavity can be configured dissimilarly to proximate portions of the flexible circuit section.

In some embodiments, a size and meandering shape of the flexible circuit section is such that certain sides of the flexible circuit section contact certain sides of the cavity while in the static state. In other embodiments, the size of the flexible circuit section is smaller than that of the cavity such that the sides of the flexible circuit section do not contact the sides of the cavity while in the static state. This alternative embodiment is shown in the exemplary configuration of FIG. 2.

In some embodiments, separate support structures 20 are positioned within the cavity 16. The support structures 20 can be made of the same compressible material as the compressible material 14. Alternatively, the support structure can be made of compressible material other than that used for the compressible material 14.

By meandering the cavity in addition to the flexible circuit section, the structural integrity of the device can be maintained during compression by an object such as a foot. The cavity and meandering shaped flexible circuit section are positioned in high strain areas of flexible printed circuit boards and rigid-flexible printed circuit boards to minimize ripping, deformation and cracking of the flexible substrate and/or conductive traces in the flexible circuit section, which results in electrical performance failure.

Although only the flexible circuit section is shown in FIGS. 1 and 2, it is understood that the flexible circuit section can be part of a flexible printed circuit board or a rigid-flexible printed circuit board. The flexible circuit section can be coupled to an electronic component or an interconnect adapter, such as a male or female adapter for subsequent interconnection to a mating adapter.

Figure 3:
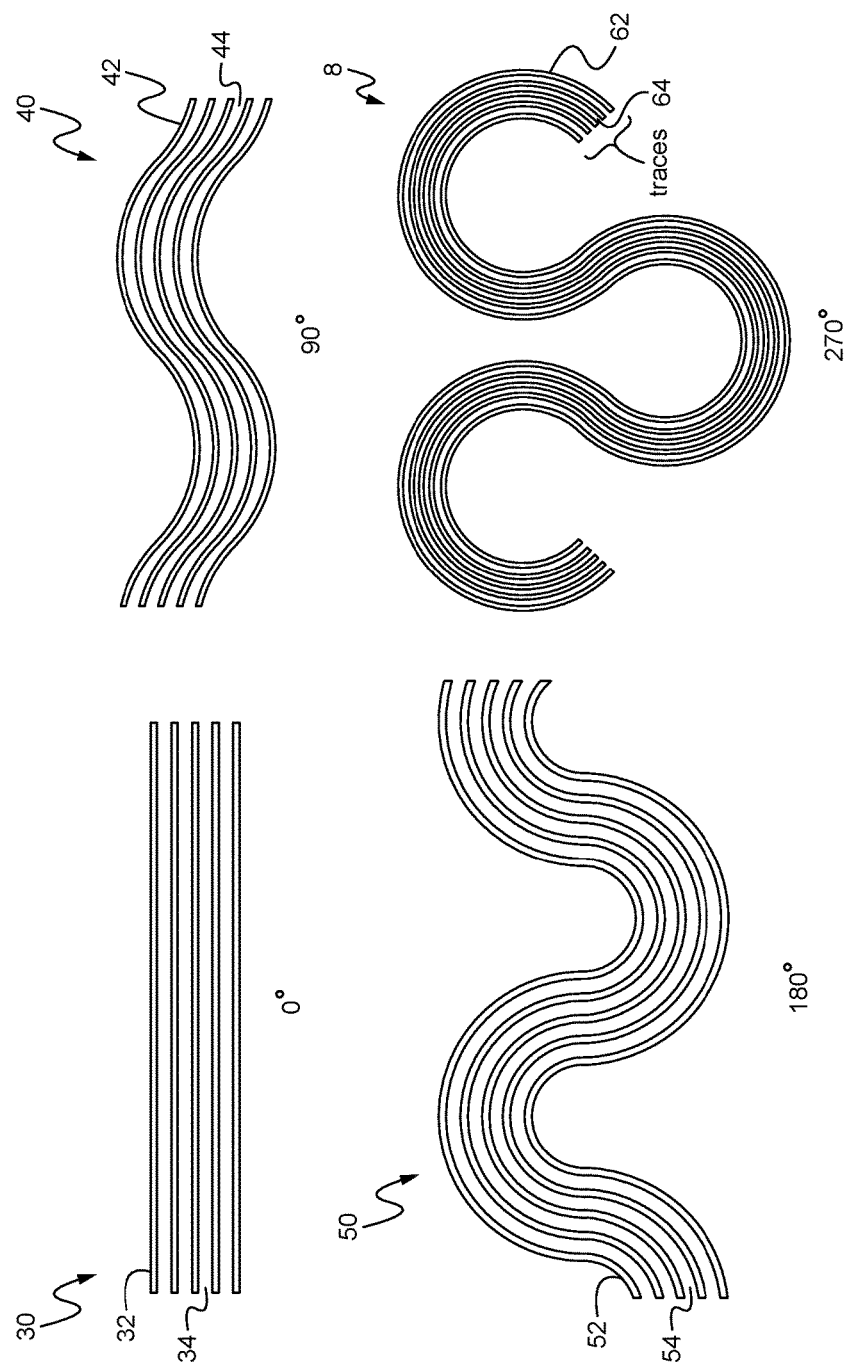
FIG. 3 illustrates a top down view of various shapes of the flexible circuit section.

Mechanical strain reduction can be achieved using multiple different meandering shapes. The meandering shape of the flexible circuit sections 8 and 18 shown in FIGS. 1 and 2, respectively, have a 270 degree angle. FIG. 3 illustrates a top down view of the flexible circuit section 8 according to some embodiments. The flexible circuit section 8 includes multiple conductive traces 62 patterned on a flexible substrate 64. The number of conductive traces 62 shown in FIG. 3 is for illustrative purposes only and can be more or less then that shown. For comparative purposes, FIG. 3 also shows a flexible circuit section 30 that does not have a meandering shape. Instead, the flexible circuit section 30 is completely straight. The flexible circuit section 30 includes conductive traces 32 patterned on a flexible substrate 34.

Additional meandering shapes can also be employed with angles ranging from 45 to 300 degrees. For example, FIG. 3 also shows a flexible circuit section 40 having conductive traces 42 and flexible substrate 44 with a 90 degree angle, and a flexible circuit section 50 having conductive traces 52 and flexible substrate 54 with a 180 degree angle. Meandering shapes reduce maximum strain seen at the conductive traces in both tension and compression. The greater the degree angle of the meandering shape, the larger the minimum support structure, such as support sections 10 in FIG. 1 and support structures 20 in FIG. 2, size in the compressible material.

In some embodiments, the flexible circuit section is secured to a bottom surface of the cavity, such as by an adhesive or other conventional securing means. In other embodiments, the flexible circuit section is not secured to the bottom surface of the cavity, but is instead positioned on the bottom surface and left to free float. By allowing the flexible circuit section to float freely in the cavity, the flexible circuit section is free to buckle to the lowest energy state, thereby substantially reducing the maximum strain seen at the conductive traces as compared to a fully encapsulated system. With lower maximum strain, the failure lifetime of the flexible circuit section is greatly improved. As can be seen in both FIGS. 1 and 2, the cavity maintains some support features interspersed with the flexible circuit section to maintain compressive stability in the z-axis (out of the plane). In a preferred embodiment, the flexible circuit section is affixed only at its ends, and not along its length.

The present application has been described in terms of specific embodiments incorporating details to facilitate the understanding of the principles of construction and operation of the mechanical strain reduction system. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A mechanical strain reduction system comprising:
   a. a flexible circuit section having a meandering shape while in a static state, wherein the flexible circuit section comprises a flexible substrate and one or more electrically conductive traces coupled to the flexible substrate, wherein the flexible circuit section further comprises a first surface and a second surface opposite the first surface; and
   b. a compressible material layer, wherein a cavity is formed in a first surface of the compressible material layer and the flexible circuit section is positioned within the cavity such that the first surface of the flexible circuit section is positioned on a bottom surface of the cavity and the second surface of the flexible circuit section is positioned within the cavity and is aligned below a top edge of the cavity on the first surface of the compressible material layer, the cavity having a shape that enables the flexible circuit section in the static state to be positioned within the cavity.

2. The mechanical strain reduction system of claim 1 wherein the meandering shape comprises a series of arched curves.

3. The mechanical strain reduction system of claim 2 wherein each arched curve has an angle between 45 and 300 degrees.

4. The mechanical strain reduction system of claim 1 wherein the meandering shape comprises a serpentine-like shape.

5. The mechanical strain reduction system of claim 1 wherein the flexible substrate comprises polyimide.

6. The mechanical strain reduction system of claim 1 wherein the one or more electrically conductive traces comprise copper conductors.

7. The mechanical strain reduction system of claim 1 wherein the shape of the cavity matches the meandering shape.

8. The mechanical strain reduction system of claim 1 further comprising one or more support structures within the cavity, wherein the flexible circuit section meanders around the one or more support structures.

9. The mechanical strain reduction system of claim 8 wherein the one or more support structures comprise the compressible material.

10. The mechanical strain reduction system of claim 1 wherein the flexible circuit section free-floats on a bottom surface of the cavity.

11. The mechanical strain reduction system of claim 1 wherein the flexible circuit section has a first end and a second end, further wherein the first end and the second end of the flexible circuit section are secured to a bottom surface of the cavity whereas a remaining portion of the flexible circuit section between the first end and the second end is free-floating on the bottom surface of the cavity.

12. The mechanical strain reduction system of claim 1 wherein an entirety of the flexible circuit section is positioned within the cavity.

13. The mechanical strain reduction system of claim 1 wherein the flexible circuit section has a first surface, a second surface opposite the first surface, and lateral side surfaces extending from the first surface to the second surface, wherein the lateral side surfaces are in contact with lateral side surfaces of the cavity.

14. The mechanical strain reduction system of claim 1 wherein the compressible material layer is foam.

15. A mechanical strain reduction system comprising:
  a. a flexible circuit section having a meandering shape while in a static state, wherein the flexible circuit section comprises a flexible substrate and one or more electrically conductive traces coupled to the flexible substrate; and
  b. a compressible material layer, wherein a cavity is formed in a first surface of the compressible material layer and the flexible circuit section is positioned within the cavity, the cavity having a shape that enables the flexible circuit section in the static state to be positioned within the cavity, further wherein the cavity has a cavity volume, and a portion of the cavity volume is unfilled by the flexible circuit section.

16. The mechanical strain reduction system of claim 15 wherein the portion of the cavity volume is air filled.

17. A mechanical strain reduction system comprising:
  a. a flexible circuit section having a meandering shape while in a static state, wherein the flexible circuit section comprises a flexible substrate and one or more electrically conductive traces coupled to the flexible substrate, wherein the flexible circuit section has a first surface, a second surface opposite the first surface, and lateral side surfaces extending from the first surface to the second surface; and
  b. a compressible material layer, wherein a cavity is formed in a first surface of the compressible material layer, the cavity having a shape that enables the flexible circuit section in the static state to be positioned within the cavity, further wherein a footprint of the flexible circuit section is smaller than a footprint of the cavity, and the flexible circuit section is positioned in the cavity such that the lateral side surfaces of the flexible circuit section do not contact lateral side surfaces of the cavity while in the static state.

\* \* \* \* \*